United States Patent
Park (10) Patent No.: US 8,120,082 B2
(45) Date of Patent: Feb. 21, 2012

(54) FERROELECTRIC MEMORY DEVICE AND METHOD FOR MANUFACTURING THE SAME

(75) Inventor: Byung-Eun Park, Seoul (KR)

(73) Assignee: University of Seoul, Foundation of Industry-Academic Cooperation, Seoul (KR)

( * ) Notice: Subject to any disclaimer, the term of this patent is extended or adjusted under 35 U.S.C. 154(b) by 432 days.

(21) Appl. No.: 11/721,599

(22) PCT Filed: Sep. 7, 2006

(86) PCT No.: PCT/KR2006/003551
§ 371 (c)(1),
(2), (4) Date: Jun. 13, 2007

(87) PCT Pub. No.: WO2007/032621
PCT Pub. Date: Mar. 22, 2007

(65) Prior Publication Data
US 2008/0105864 A1  May 8, 2008

(30) Foreign Application Priority Data
Sep. 12, 2005 (KR) .................. 10-2005-0084571
Sep. 6, 2006 (KR) .................. 10-2006-0085666

(51) Int. Cl.
H01G 7/06 (2006.01)

(52) U.S. Cl. ........... 257/295; 257/40; 257/298; 257/410

(58) Field of Classification Search ................ 257/295, 257/40, 298, 410
See application file for complete search history.

(56) References Cited

U.S. PATENT DOCUMENTS

| 5,840,615 A | 11/1998 | Aoki et al. |
| 6,812,509 B2 * | 11/2004 | Xu ............................. 257/295 |
| 2006/0056225 A1 * | 3/2006 | Hashimoto et al. ........... 365/145 |

FOREIGN PATENT DOCUMENTS

| JP | 57-010231 | 1/1982 |
| JP | 05-102127 | 4/1993 |
| WO | WO03050814 | 6/2003 |

* cited by examiner

Primary Examiner — Long Pham
(74) Attorney, Agent, or Firm — Kelleher Patent Law; Sean Liam Kelleher (57) ABSTRACT

Disclosed relates to a ferroelectric memory device that is manufactured easily, operates at low voltage and has excellent data preservation period, and a method of manufacturing the same. In the present invention, a ferroelectric layer 60 is formed on a part corresponding to a channel region 4 on the silicon substrate 1. The ferroelectric layer 60 made of an organic material such as PVDF, etc. shows polarization characteristics at low voltage below 1V, and such polarization characteristics continue over a specific time period, not changed as time goes by.

Accordingly, it is possible to manufacture a ferroelectric memory device that operates at low voltage and is manufactured with a simplified structure in a simplified method.

5 Claims, 9 Drawing Sheets

Fig. 1

PRIOR ART

Fig. 2

PRIOR ART

FERROELECTRIC MEMORY DEVICE AND METHOD FOR MANUFACTURING THE SAME

TECHNICAL FIELD

The present invention relates to a non-volatile memory device using ferroelectrics and, more particularly, to a ferroelectric memory device that is manufactured easily, operates at low voltage and has excellent data preservation period, and a method of manufacturing the same.

BACKGROUND ART

Figure 1:
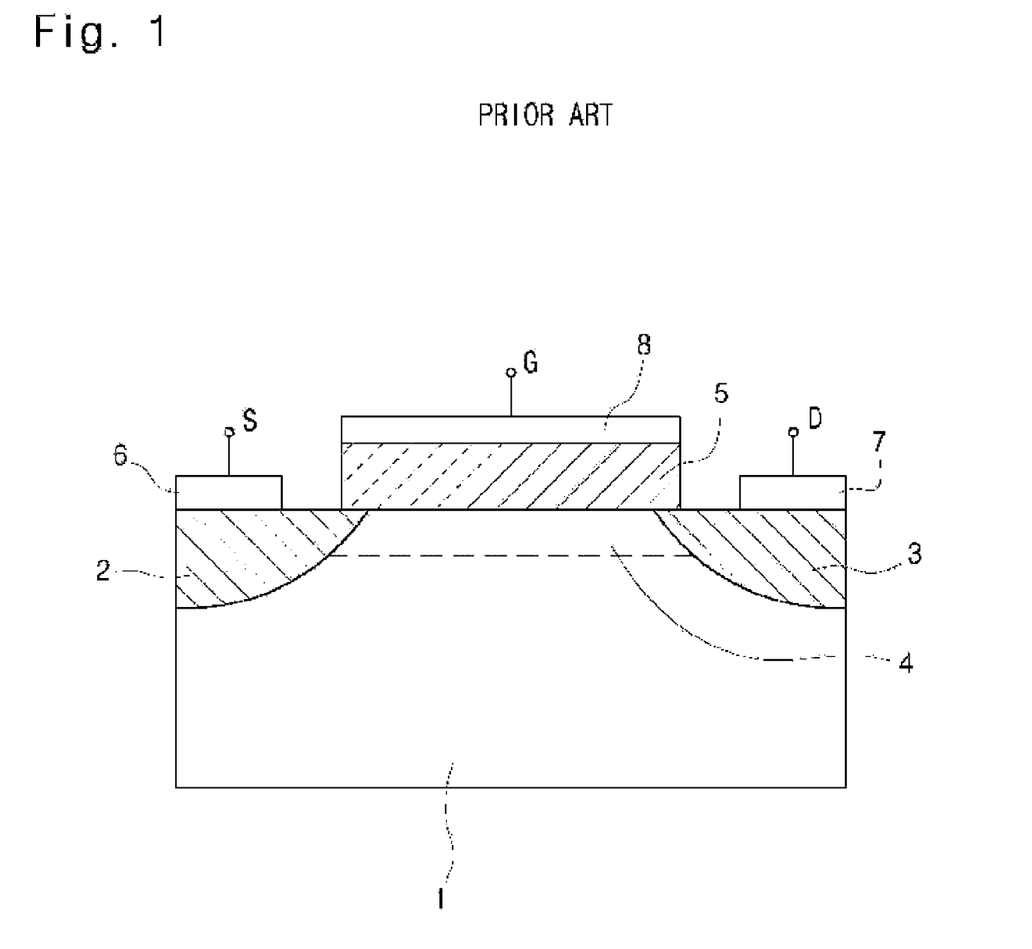
FIG. 1 is a sectional view depicting a conventional MFS type ferroelectric memory device.

Recently, various researches aimed at materializing transistors or memory devices using ferroelectrics have continued to progress. FIG. 1 is a sectional view depicting a typical structure of a metal-ferroelectric-semiconductor (MFS) type memory device using a ferroelectric.

In FIG. 1, a source region 2 and a drain region 3 are formed in specific regions on a silicon substrate 1, and a ferroelectric thin film or a ferroelectric layer 5 is provided on a channel region 4 between the source and drain regions 2 and 3. Here, the ferroelectric layer 5 is formed with inorganic materials having ferroelectric properties such as PZT(PbZrxTi1-xO3), SBT(SrBi2Ta2O9), BLT((Bi,La)4Ti3O12), etc. A source electrode 6, a drain electrode 7, a gate electrode 8, made of metal materials, are arranged on the top of the source region 2, the drain region 3 and the ferroelectric layer 5, respectively.

In the ferroelectric memory device having the above-described structure, the ferroelectric layer 5 shows polarization characteristics according to voltages applied through the gate electrode 8, a conductive channel is formed between the source region 2 and the drain region 3 due to the polarization characteristics and, accordingly, an electric current flows between the source electrode 6 and drain electrode 7. Particularly, in the above-described structure, the polarization characteristics are maintained uniformly even if the voltage applied through the gate electrode 8 is cut off. Accordingly, the above-described structure has attracted attention as a structure that can form a non-volatile memory device with only a transistor, not applying a separate capacitor.

However, the ferroelectric memory device having the above-described structure has some drawbacks as follows. That is, if the ferroelectric layer 5 is formed directly on the silicon substrate 1, a transition layer of low quality is formed on the boundary surface between the ferroelectric layer 5 and the silicon substrate 1 during the formation of the ferroelectric layer 5, and elements such as Pb and Bi in the ferroelectric layer 5 are diffused in the silicon substrate 1, which makes it difficult to form a ferroelectric layer 5 of high quality. Accordingly, it causes a problem in that the polarization characteristics of the ferroelectric layer 5, that is, the data preservation period is much shortened.

Figure 2:
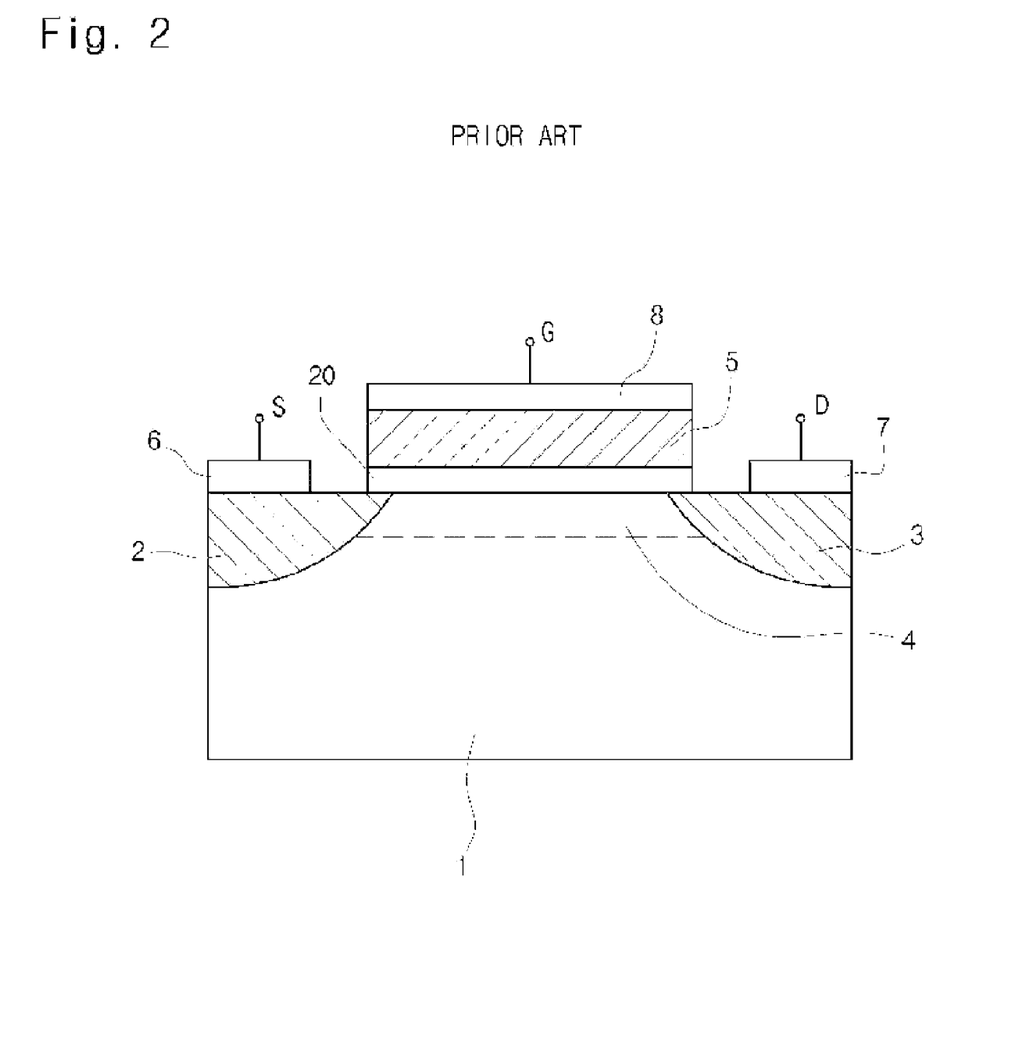
FIG. 2 is a sectional view depicting a conventional MFIS type ferroelectric memory device.

Accordingly, taking the above-described drawbacks into consideration, a metal-ferroelectric-insulator-semiconductor structure (MFIS), as it is called, has been proposed for forming a buffer layer 20 made mainly of an oxidized substance between the silicon substrate 1 and the ferroelectric layer 5, as illustrated in FIG. 2.

However, such MFIS type ferroelectric memory device requires an additional manufacturing process for forming the buffer layer 20 and also the data preservation effect is not good. That is, the data preservation period does not exceed 30 days even in case of an excellent product fabricated in a laboratory at present.

DISCLOSURE

Technical Problem

The present invention has been contrived taking the above-described circumstances into consideration and, an object of the present invention is to provide a ferroelectric memory device, which can be readily manufactured with a simplified structure and enhances the data preservation period significantly.

Moreover, another object of the present invention is to provide a ferroelectric memory device that operates at low voltage below 1V.

Furthermore, another object of the present invention is to provide a method of manufacturing a ferroelectric memory device having the above-described properties.

Technical Solution

To accomplish an object in accordance with a first aspect of the present invention, there is provided a ferroelectric memory device comprising: a source region and a drain region formed in specific regions on a semiconductor substrate; a channel region provided between the source and drain regions; an organic ferroelectric layer formed in the area corresponding to the channel region on the semiconductor substrate; and a source electrode, a drain electrode and a gate electrode arranged on the top of the source region, the drain region and the organic ferroelectric layer, respectively, the organic ferroelectric layer being coupled with the semiconductor substrate through van der Waals bonding or hydrogen bonding.

Moreover, the organic ferroelectric layer is a PVDF layer.

Furthermore, the organic ferroelectric layer includes at least one selected from the group consisting of polyvinylidene fluoride (PVDF), PVDF polymer, PVDF copolymer PVDF terpolymer, odd-numbered nylon, cyano-polymer, their polymer and copolymer.

In addition, the organic ferroelectric layer has β-phase crystals.

Additionally, the organic ferroelectric layer has a film thickness below 1 μm.

To accomplish another object in accordance with a second aspect of the present invention, there is provided a method of manufacturing a ferroelectric memory device comprising: a first step of forming a source region and a drain region in specific regions on a semiconductor substrate; a second step of forming a channel region between the source and drain regions; a third step of forming an organic ferroelectric layer having a film thickness below 1 μm in the channel region on the semiconductor substrate; and a fourth step of forming electrodes on the source region, the drain region and the organic ferroelectric layer.

Moreover, the third step includes the steps of: treating the semiconductor substrate with a surface treatment solution; and forming an organic ferroelectric layer on the semiconductor substrate.

Furthermore, the surface treatment solution generates H-groups on the surface of the semiconductor substrate.

In addition, the surface treatment solution includes at least one selected from the group consisting of silane, aki-silane, aryl-silane, fluorinated alkyl-silane, perfluorinated triethoxy silane, and heptadeca-fluorodecyl triethoxy silane solutions.

Moreover, the surface treatment solution generates OH-groups on the surface of the semiconductor substrate.

Furthermore, the surface treatment solution is a 2-propanol solution into which KOH is saturated.

In addition, the surface treatment solution is a mixed solution of H2SO4 and H2O2.

Moreover, the method of manufacturing a ferroelectric memory device includes a step of phase-transitioning of the ferroelectric layer, where the ferroelectric layer is set to be of β-phase.

Furthermore, the step of phase-transitioning of the ferroelectric layer comprises: a first step of raising the temperature of the ferroelectric layer over a temperature, where a crystal structure of β-phase is established; a second step of lowering the temperature of the ferroelectric layer monotonously to the temperature, where the crystal structure of β-phase is established; and a third step of dropping the temperature of the ferroelectric layer rapidly.

In addition, the step of phase-transitioning of the ferroelectric layer comprises: a first step of raising the temperature of the ferroelectric layer to a temperature, where a crystal structure of β-phase is established; and a second step of dropping the temperature of the ferroelectric layer rapidly.

DESCRIPTION OF DRAWINGS

The above and other features of the present invention will be described with reference to certain exemplary embodiments thereof illustrated the attached drawings in which.

BEST MODE FOR THE INVENTION

Hereinafter, the present invention will now be described more fully with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

First, the basic concept of the present invention will now be described.

As described above, the ferroelectric materials being used at present are inorganic materials such as PZT, SBT, BLT, etc. However, such inorganic materials have fundamental problems in establishing the data preservation period long due to the deterioration of polarization characteristics caused according to the lapse of time. Moreover, the inorganic ferroelectrics are expensive and require a high temperature treatment as well as high-priced equipments in forming thin films.

Other than such inorganic materials, various kinds of organic materials having ferroelectric characteristics have been known. The typical organic materials may be exemplified by polyvinylidene fluoride (PVDF), PVDF polymer, PVDF copolymer or PVDF terpolymer and, further, odd-numbered nylon, cyano-polymer and their polymer or copolymer. Among such ferroelectric organic materials described above, PVDF, its polymer, copolymer and terpolymer have been mainly studied as organic semiconductor materials.

Figure 3:
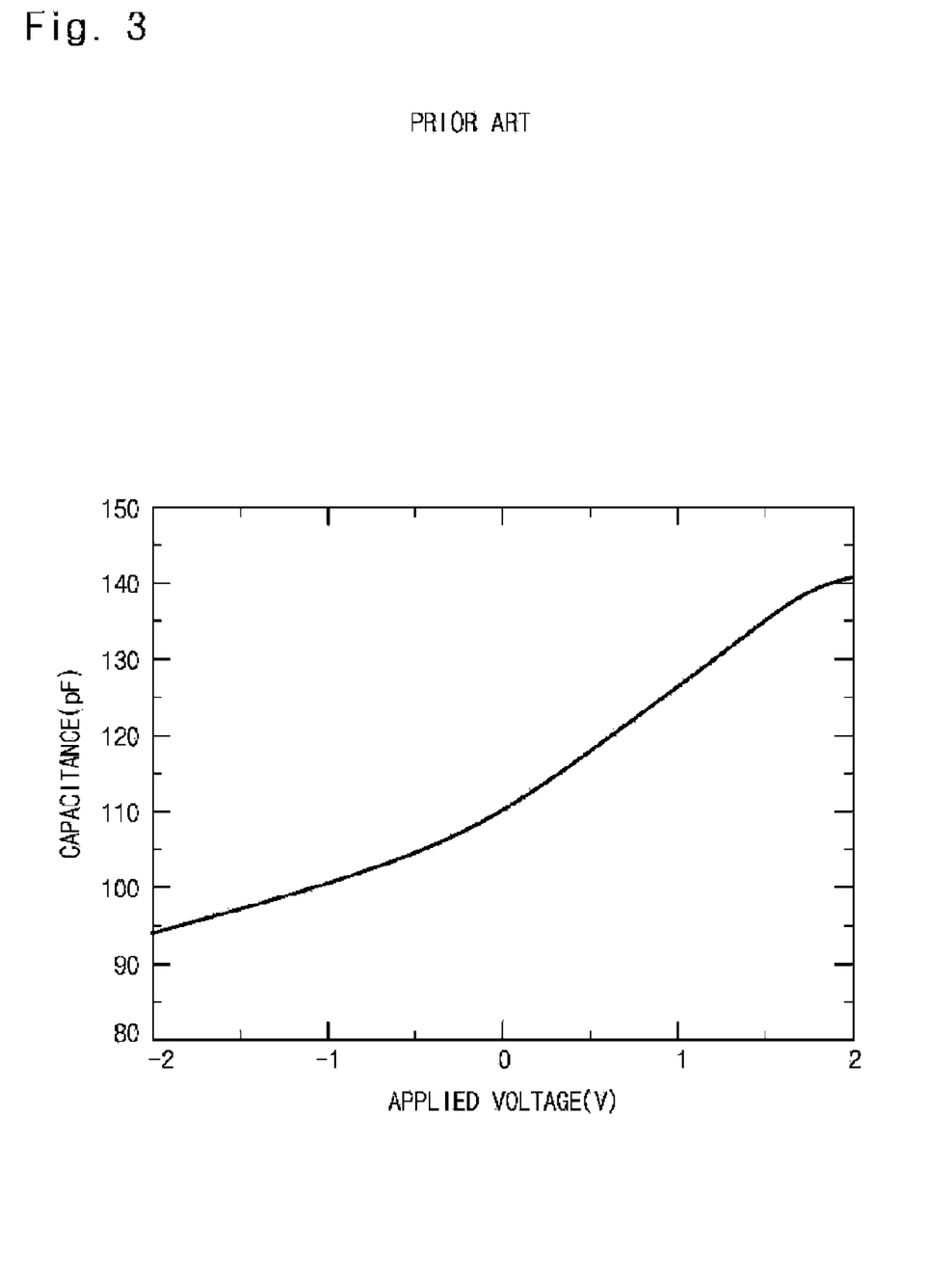
FIG. 3 is a graph illustrating voltage-capacitance characteristics of a general organic material.

In general, to utilize such ferroelectric organic materials in manufacturing memory devices, corresponding organic materials should have hysteresis polarization characteristics against the applied voltages. However, the PVDF described above shows capacitances increased according to the applied voltages, and does not have the hysteresis characteristics suitably applied to the memory devices, as illustrated in FIG. 3.

According to the study results of the inventor of the present invention, it has been confirmed that the PVDF having four crystal structures of α, β, γ and δ shows a good hysteresis polarization characteristic in the crystal structure of β-phase. Here, to crystallize the PVDF with β-phase, the PVDF is deposited on a semiconductor substrate and then cooled rapidly at a temperature, where phase transitions occur, e.g., 60 to 70□, and preferably, about 65□, or at a temperature, where the PVDF shows β-phases.

Figure 4A:
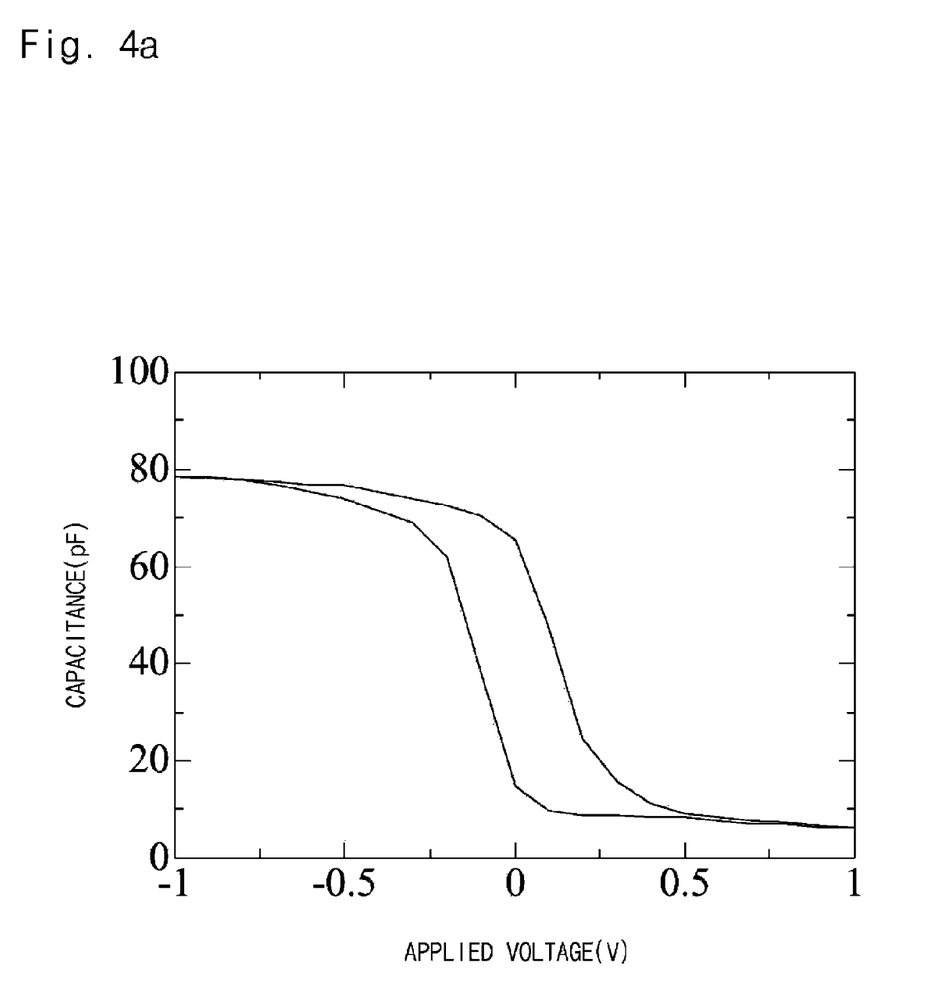
FIGS. 4 and 5 are graphs illustrating voltage-capacitance characteristics of a ferroelectric organic material applied to the present invention.
Figure 4B:
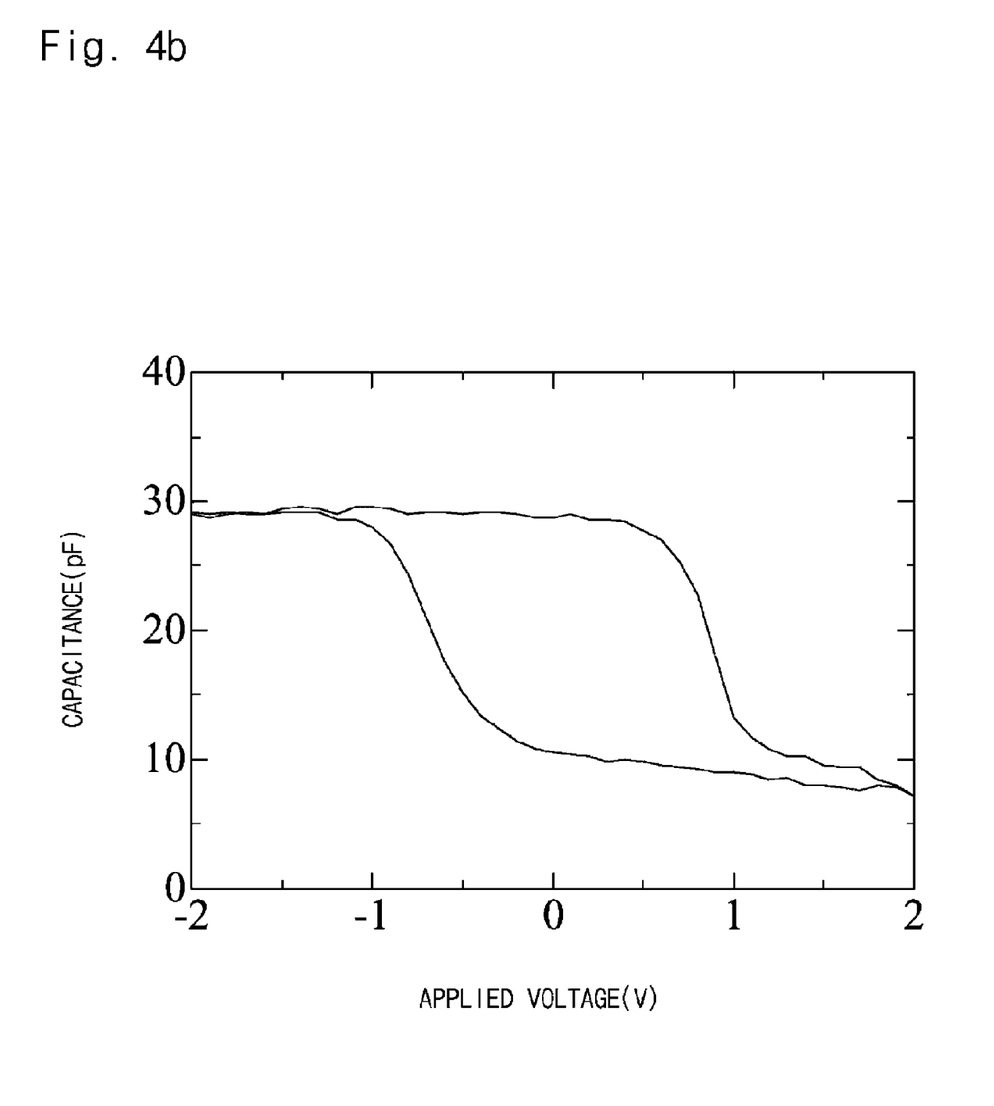

FIGS. 4a and 4b are graphs illustrating polarization characteristics of the PVDF thin film, manufactured in accordance with the present invention, against the voltages applied thereto, in which the measurement was made by forming a PVDF thin film of β-phase on the silicon substrate, forming an upper electrode on the PVDF thin film and then applying specific voltages between the silicon substrate and the upper electrode. Particularly, FIG. 4a illustrates a PVDF thin film formed in a thickness of 10 nm, approximately, and FIG. 4b depicts a PVDF thin film formed in a thickness of 60 nm, approximately. Such thin films were formed in such a manner that after forming a PVDF having a specific thickness via a spin-coating process below 3,000 rpm and an annealing process above 120□ for example, the temperature of the PVDF thin film was monotonously lowered on a hot plate, and finally the PVDF thin film was cooled rapidly at 65□, for example.

As can be seen in FIGS. 4a and 4b, the PVDF thin film manufactured in accordance with the present invention has excellent hysteresis characteristics in that the capacitance value is decreased with the increase of the applied voltage in about 0 to 1V, and the capacitance value is increased with the decrease of the applied voltage in about 0 to −1V.

Figure 5A:
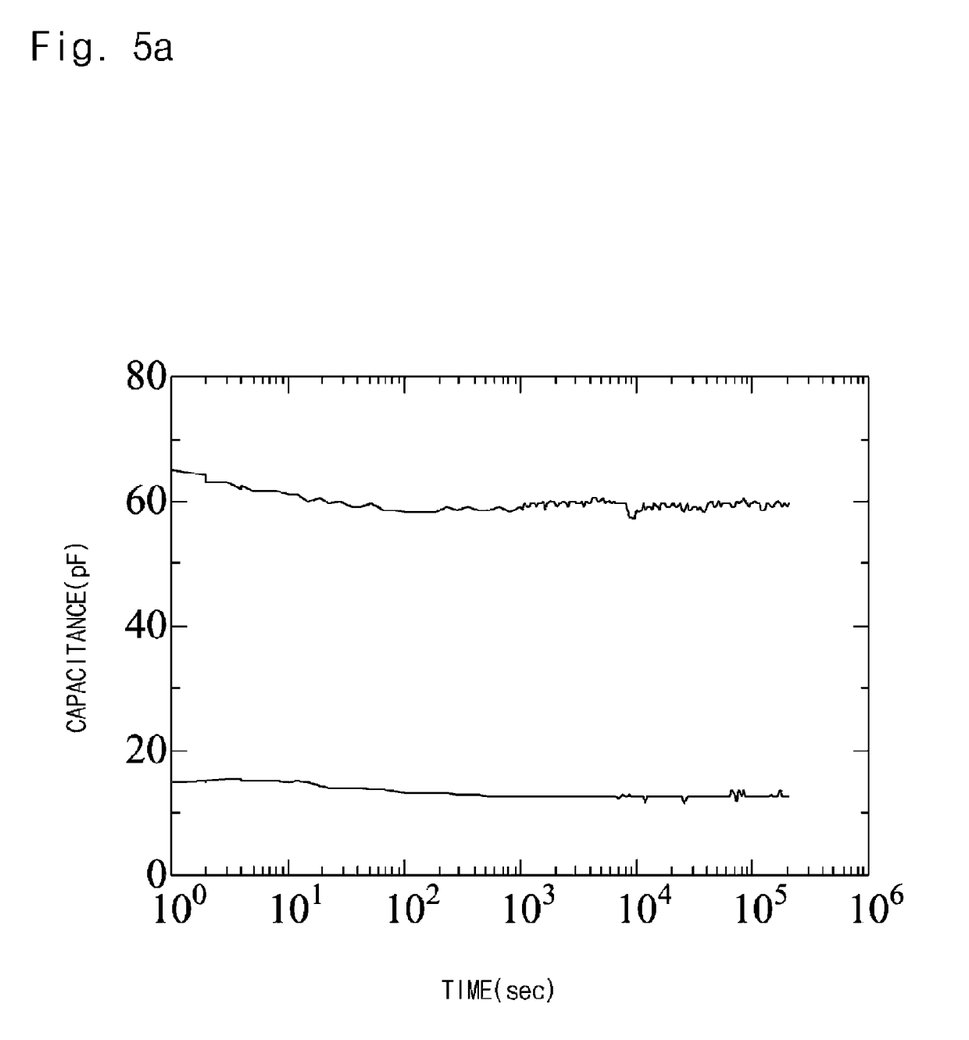
Figure 5B:
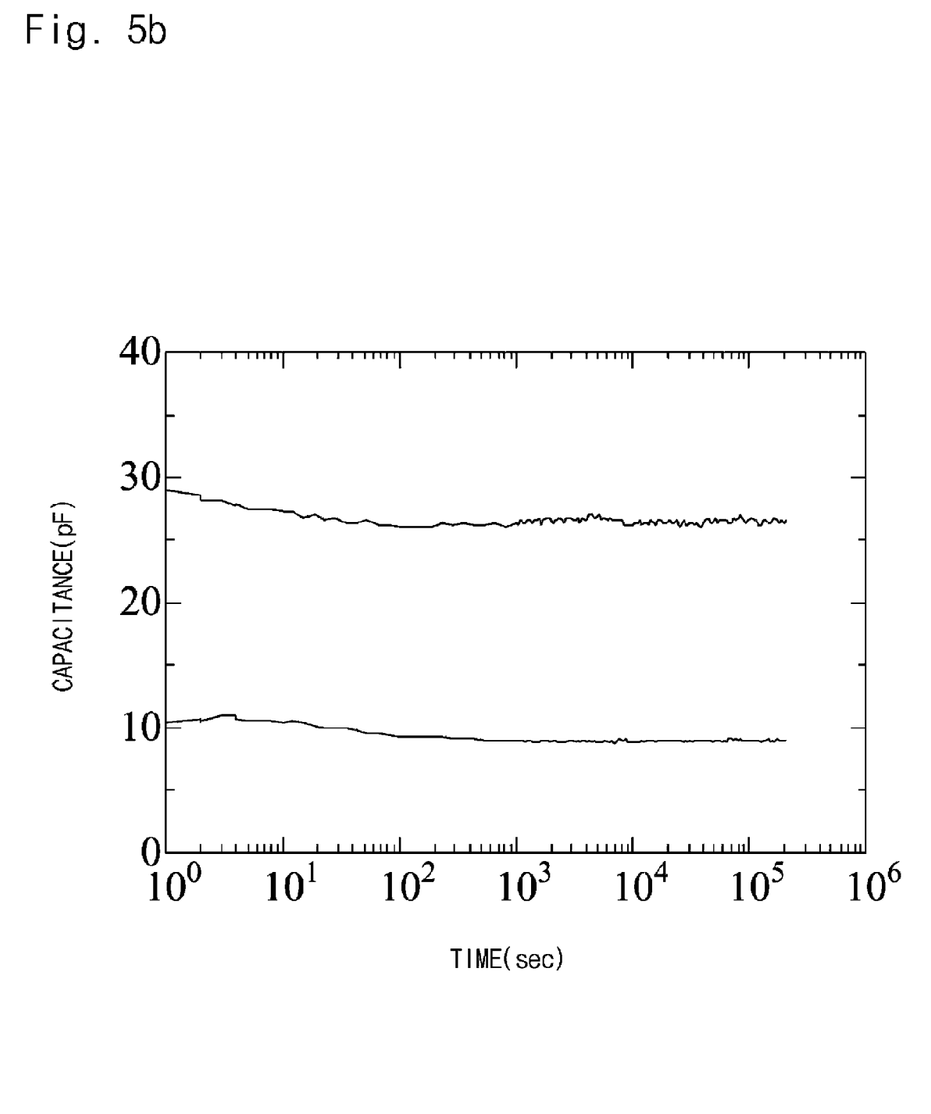

Moreover, FIGS. 5a and 5b are graphs measuring the changes of the capacitance values of the PVDF thin film formed as described above according to the lapse of time, in which FIGS. 5a and 5b correspond to FIGS. 4a and 4b, respectively.

As can be learned from FIGS. 5a and 5b, it has been confirmed that the capacitance value of the PVDF thin film formed in accordance with the present invention is not changed according to the lapse of time but maintained over a specific time period.

Accordingly, the PVDF thin film of the present invention has the following characteristics as confirmed from FIGS. 4 and 5.

First, the PVDF thin film of the present invention shows a capacitance value over a specific value at 0V. This means that the polarization value of the PVDF thin film is not changed but maintained at 0V, where no voltages are applied from the outside. That is, the PVDF thin film in accordance with the present invention can be effectively used as a material for manufacturing a non-volatile memory device.

Second, the PVDF thin film in accordance with the present invention shows a memory characteristic even in a range below 1V. That is, it is possible to record and delete data at a very low voltage. Accordingly, the PVDF in accordance with the present invention can be effectively used in materializing the memory devices that operate at low voltages.

Last, the PVDF thin film in accordance with the present invention has a property that the capacitance value is not changed but maintained uniformly. That is, the PVDF thin film in accordance with the present invention has an excellent data preservation property that preserves data value recorded once over a specific time period.

Subsequently, a structure of the ferroelectric memory device in accordance with the present invention and a method of manufacturing the same will now be described with reference to FIGS. 6 and 7.

Figure 6:
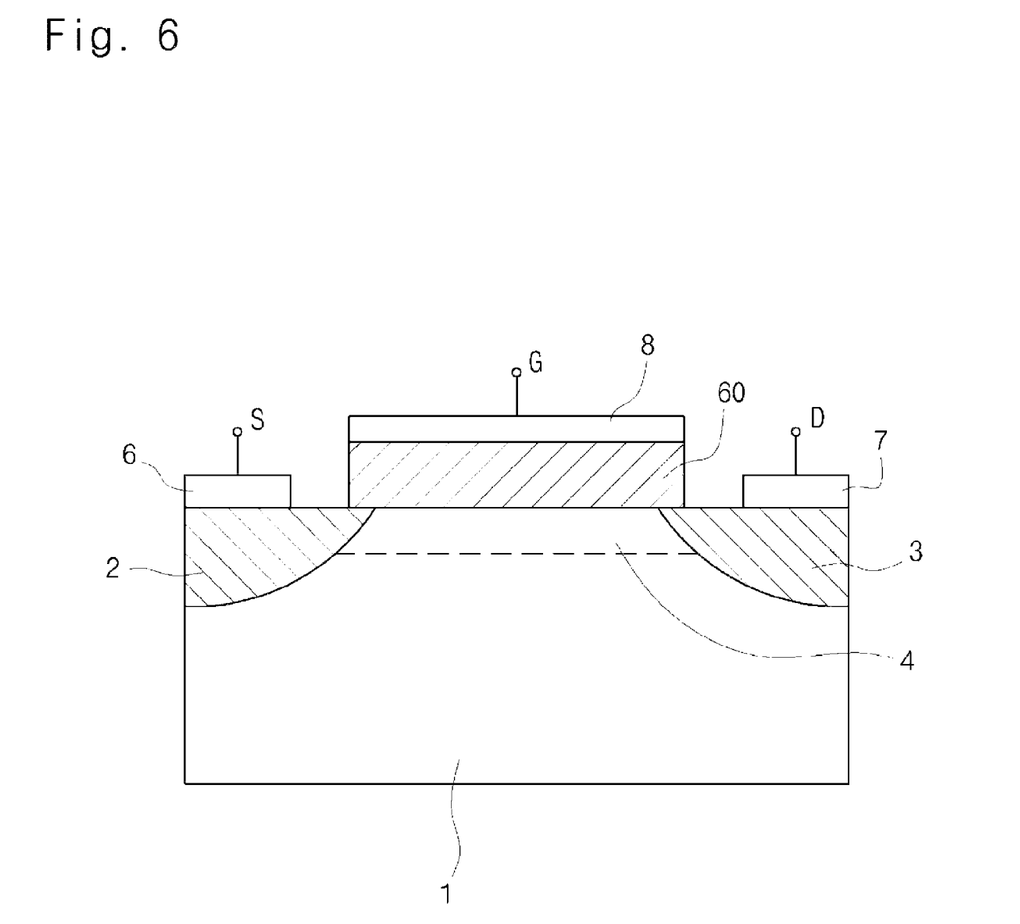
FIG. 6 is a sectional view depicting a structure of a ferroelectric memory device in accordance with a preferred embodiment of the present invention.

FIG. 6 is a sectional view depicting a structure of the ferroelectric memory device in accordance with the present invention.

The memory device of the invention has the same structure as the conventional one depicted in FIG. 1, in which a source region 2 and a drain region 3 are formed in specific regions on a silicon substrate 1, and a ferroelectric thin film or a ferroelectric layer 60 is provided on a channel region 4 between the source and drain regions 2 and 3. Here, the ferroelectric layer 60 is formed with ferroelectric organic materials as described above. The available ferroelectric organic materials may include polyvinylidene fluoride (PVDF), PVDF polymer, PVDF copolymer PVDF terpolymer and, further, odd-numbered nylon, cyano-polymer, their polymer and copolymer. Meanwhile, a source electrode 6, a drain electrode 7 and a gate electrode 8 are arranged on the top of the source region 2, the drain region 3 and the organic ferroelectric layer 60, respectively.

In the structure depicted in FIG. 6, the buffer layer 20 of MFIS type ferroelectric memory device shown in FIG. 2 is removed. Accordingly, the structure of the ferroelectric memory device comprising just the ferroelectric layer 60 and the various electrodes 6, 7 and 8 can be simplified like that of the general transistor.

Figure 7:
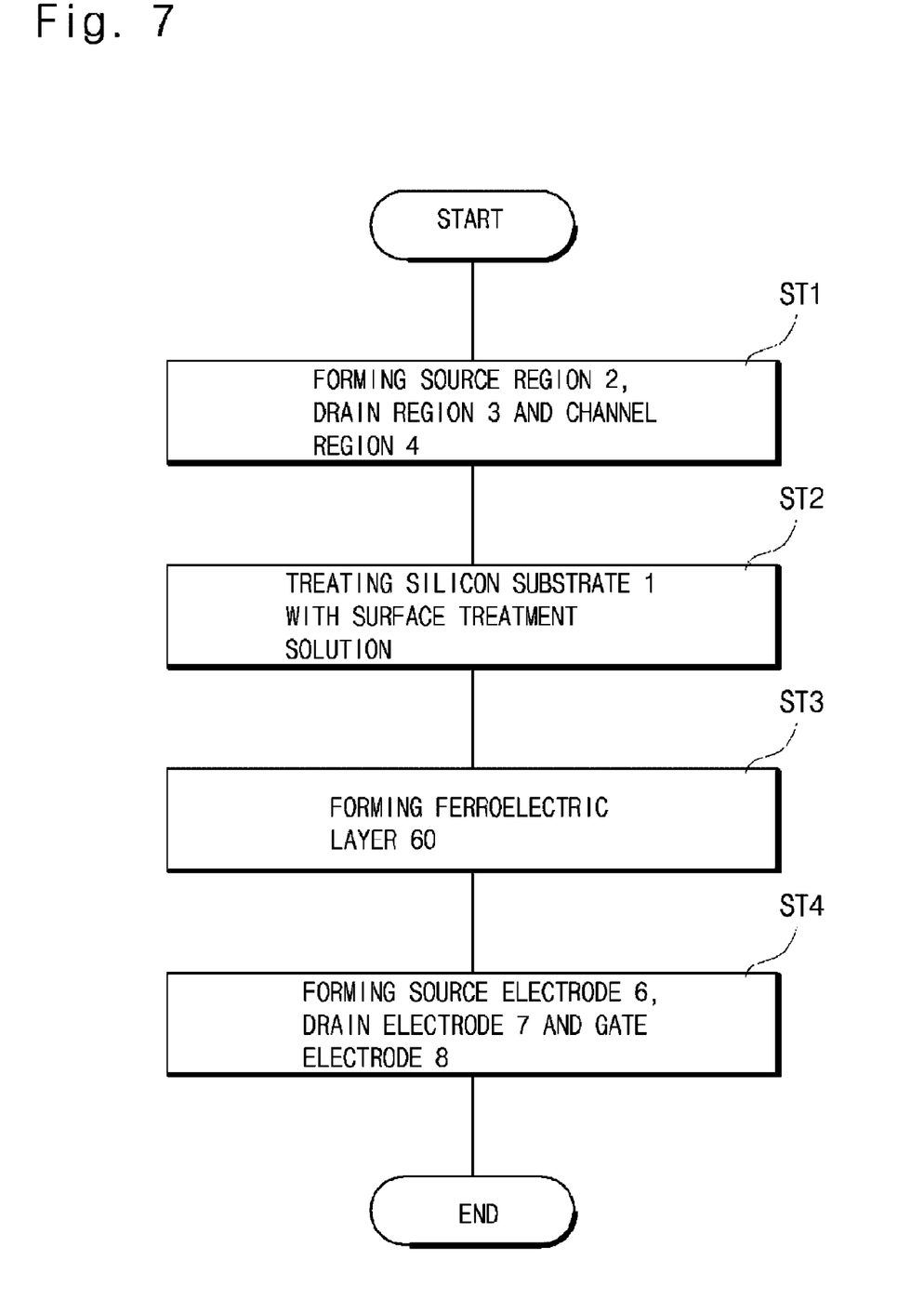
FIG. 7 is a flowchart illustrating a method of manufacturing a ferroelectric memory device in accordance with the present invention.

Meanwhile, FIG. 7 is a flowchart illustrating a method of manufacturing the ferroelectric memory device depicted in FIG. 6 in accordance with the present invention.

In FIG. 7, first, the source and the drain region 2 and 3 and the channel region 4 are formed in specific regions on the silicon substrate 1 in the common method (ST1).

Next, the silicon substrate 1 is treated with a specific surface treatment solution (ST2). In general, a semiconductor substrate such as silicon, GaAs, etc. is used in manufacturing a semiconductor device. Such semiconductor substrates are cut from an ingot and polished to use. In the process of polishing the semiconductor substrates cut from the ingot, since dangling bonds on the semiconductor substrates are cut and removed, the bonding force between the semiconductor substrate and the organic material applied thereto is remarkably decreased. That is, there have been problems in that the materials such as organics and the like are not coated or stacked on the semiconductor substrate.

If the bonding force between the semiconductor substrate and the organic material is lowered, it is difficult to form a thin film below a specific thickness on the semiconductor substrate. That is, the organic layer formed on the semiconductor substrate becomes thicker inevitably. Meanwhile, the ferroelectric memory is used for materializing a non-volatile memory device using polarization characteristics of the ferroelectric layer. However, if the organic layer is formed thickly on the semiconductor substrate, it is necessary to apply a high voltage to the organic layer in order to obtain the polarization characteristics of the corresponding organic layer. That is, the high voltage is required for driving the memory device.

Accordingly, it is required to form the thin film of the ferroelectric organic layer below a specific thickness, preferably, below 1 μm in order to materialize an organic ferroelectric memory device that can operate at low voltage below a specific voltage.

The present inventor has confirmed from the researches that van der Waals bonding or hydrogen bonding is a very useful means for bonding an organic material with the semiconductor substrate. Moreover, it is desirable that H-groups or OH-groups be generated on the surface of the semiconductor substrate for the van der Waals bonding or the hydrogen bonding.

The present inventor has conducted various experiments in generating H-groups or OH-groups on the semiconductor substrate and, as a result, it is confirmed that silanes, KOH, or a mixed solution of H2SO4 and H2O2 may be used in generating H-groups or OH-groups. In more detail, silane, akisilane, aryl-silane, fluorinated alkyl-silane, perfluorinated triethoxy silane, and heptadeca-fluorodecyl triethoxy silane solutions are useful in generating H-groups. Moreover, a 2-propanol solution into which KOH is saturated and a mixed solution of H2SO4 and H2O2 mixed in a fixed ratio are useful in generating OH-groups. Of course, as these solutions for the surface treatment, any other solutions that can generate H-groups or OH-groups on the semiconductor substrate can be used in addition to the above solutions.

After treating the surface of the silicon substrate 1 using the surface treatment solution described above, the silicon substrate 1 is dried with an air gun using nitrogen, for example. An organic ferroelectric material is stacked on the silicon substrate 1 using spin coating, vacuum deposition, screen printing, jet printing or Langmuir-Blodgett (LB) technique, etc., and unnecessary regions except for the gate region are removed using an etching solution such as a weak solution of hydrofluoric acid (HF), etc., thus forming a ferroelectric layer 60 (ST3).

Particularly, after forming the ferroelectric layer 60, the substrate 1 is put on a hot plate and heat is applied to the substrate 1 so that the temperature of the substrate 1 is raised over a specific temperature. Here, the temperature of the hot plate is set over a temperature, where the crystal structure of the ferroelectric layer 60 shows β-phases.

Subsequently, the temperature of the substrate 1 is lowered monotonously and, if the temperature of the substrate 1, more accurately, the temperature of the ferroelectric layer 60 is lowered at 60 to 70□, preferably, at 65□, where the ferroelectric shows β-phases, the temperature of the substrate 1 is cooled rapidly so that the crystal structure of the ferroelectric layer 60 is fixed to be β-phase.

Next, the source electrode 6, the drain electrode 7 and the gate electrode 8 are formed on the resulting structure, thus materializing a memory device (ST4).

As above, the preferred embodiment of the present invention has been described. However, the above-described embodiment is one of the desirable examples of the present invention and the present invention can be embodied with various modifications within the range, not departing from the spirit and scope of the present invention.

For example, in the above-described embodiment of the present invention, after forming the ferroelectric layer 60, i.e., the PVDF layer, the crystal structure of the PVDF layer is determined to be of β-phase in such a manner that the substrate 1 is cooled rapidly at a temperature, where the PVDF layer shows β-phases.

However, the above-described method of manufacturing the memory device may cause a problem in that the crystal structure of the ferroelectric layer 60 is changed by the heat applied to the substrate 1 when fabricating the various electrodes 6, 7 and 8 after forming the ferroelectric layer 60.

Accordingly, it is desirable that the crystal structure of the ferroelectric layer 60 be established after completing the process of manufacturing a memory device by forming the source electrode 6, the drain electrode 7 and the gate electrode 8, not establishing the crystal structure of the ferroelectric layer 60 directly after forming the ferroelectric layer 60.

Moreover, the generation of H-groups or OH-groups on the semiconductor substrate has been described set limited to the use of silanes, KOH or a mixed solution of H2SO4 and H2O2. However, the present invention can use any other surface treatment solutions that can induce the van der Waals bonding or the hydrogen bonding between the semiconductor substrate and the organic material.

Furthermore, as methods of stacking an organic layer on a semiconductor substrate, the present invention can apply any other stacking methods available at present in addition to the deposition, sputtering and spin coating.

In addition, the present invention can be applied to a GaAs substrate and any other substrates used in fabricating semiconductor devices, not limited to the silicon substrate.

The invention is not limited to the disclosed embodiments, but on the contrary, is intended to cover various modifications and equivalent arrangements included within the spirit and scope of the appended claims.

INDUSTRIAL APPLICABILITY

According to the present invention as described above, a non-volatile memory device is materialized with a simplified transistor structure. Accordingly, the manufacturing cost of the non-volatile memory device may come down and the manufacturing process can be simplified significantly.

Moreover, according to the present invention, it is possible to materialize a non-volatile memory device that operates at a very low voltage, since the polarization characteristics of the organic ferroelectric layer are determined at 1V or less.

Furthermore, it is possible to materialize a ferroelectric transistor that operates at a very low voltage via the same method and structure.

The invention claimed is:

1. A ferroelectric memory device comprising:
   a source region and a drain region formed in specific regions on a semiconductor substrate;
   a channel region provided between the source and drain regions;
   an organic ferroelectric layer formed in the area corresponding to the channel region on the semiconductor substrate; and
   a source electrode, a drain electrode and a gate electrode arranged on the top of the source region, the drain region and the organic ferroelectric layer, respectively,
   the organic ferroelectric layer being coupled with the semiconductor substrate through van der Waals bonding or hydrogen bonding.

2. The ferroelectric memory device as recited in claim 1, wherein the organic ferroelectric memory device is a PVDF layer.

3. The ferroelectric memory device as recited in claim 1, wherein the organic ferroelectric layer includes at least one selected from the group consisting of polyvinylidene fluoride (PVDF), PVDF polymer, PVDF copolymer PVDF terpolymer, odd-numbered nylon, cyano-polymer, their polymer and copolymer.

4. The ferroelectric memory device as recited in claim 2 or 3, wherein the organic ferroelectric layer has β-phase crystals.

5. The ferroelectric memory device as recited in claim 1, wherein the organic ferroelectric layer has a film thickness below 1 μm.

* * * * *